United States Patent
Shell et al.

(10) Patent No.: US 6,787,788 B2
(45) Date of Patent: Sep. 7, 2004

(54) ELECTRODE INSULATOR MATERIALS FOR USE IN EXTREME ULTRAVIOLET ELECTRIC DISCHARGE SOURCES

(76) Inventors: Melissa Shell, 12852 NW. Walker Dr., Portland, OR (US) 97229; Bryan J. Rice, 535 NW. 317th Ave., Hillsboro, OR (US) 97124

( * ) Notice: Subject to any disclaimer, the term of this patent is extended or adjusted under 35 U.S.C. 154(b) by 6 days.

(21) Appl. No.: 10/349,740

(22) Filed: Jan. 21, 2003

(65) Prior Publication Data

US 2004/0140439 A1 Jul. 22, 2004

(51) Int. Cl.[7] .............................................. H01J 35/20
(52) U.S. Cl. .............................. 250/504 R; 250/493.1; 378/119
(58) Field of Search .......................... 250/504 R, 493.1; 378/119

(56) References Cited

U.S. PATENT DOCUMENTS

| | | | | |
|---|---|---|---|---|
| 5,521,389 A | * | 5/1996 | Kim | 250/423 R |
| 5,945,677 A | * | 8/1999 | Leung et al. | 250/396 R |
| 6,356,618 B1 | * | 3/2002 | Fornaciari et al. | 378/119 |
| 6,452,194 B2 | * | 9/2002 | Bijkerk et al. | 250/492.2 |
| 6,566,668 B2 | * | 5/2003 | Rauch et al. | 250/504 R |
| 6,586,757 B2 | * | 7/2003 | Melnychuk et al. | 250/504 R |

* cited by examiner

Primary Examiner—John R. Lee
Assistant Examiner—Johnnie L Smith, II
(74) Attorney, Agent, or Firm—Fish & Richardson P.C.

(57) ABSTRACT

An insulator may be operable to electrically insulate a cathode from an anode in an extreme ultraviolet (EUV) source of an EUV lithography tool. The insulator may be made of an aluminosilicate or a SiN/SiC material. The extreme ultraviolet source may be operable to produce a plasma which emits extreme ultraviolet radiation.

27 Claims, 4 Drawing Sheets

US 6,787,788 B2

ELECTRODE INSULATOR MATERIALS FOR USE IN EXTREME ULTRAVIOLET ELECTRIC DISCHARGE SOURCES

BACKGROUND

A microchip manufacturing process may deposit various material layers on a wafer and form a photosensitive film (photoresist) on the deposited layers. The process may use lithography to transmit light through (transmissive optics) or reflect light from (reflective optics) a reticle (patterned mask) onto the photoresist, which transfers a patterned image onto the photoresist. The process may remove portions of the photoresist which are exposed to light. The process may etch portions of the wafer which are not protected by the remaining photoresist. Some of these acts may be repeated.

DETAILED DESCRIPTION

EUV Lithography Tool

An Extreme Ultraviolet (EUV) lithography tool may be used to print a pattern on a photoresist with dimensions which are smaller than dimensions achieved by other lithography tools.

Figure 1:
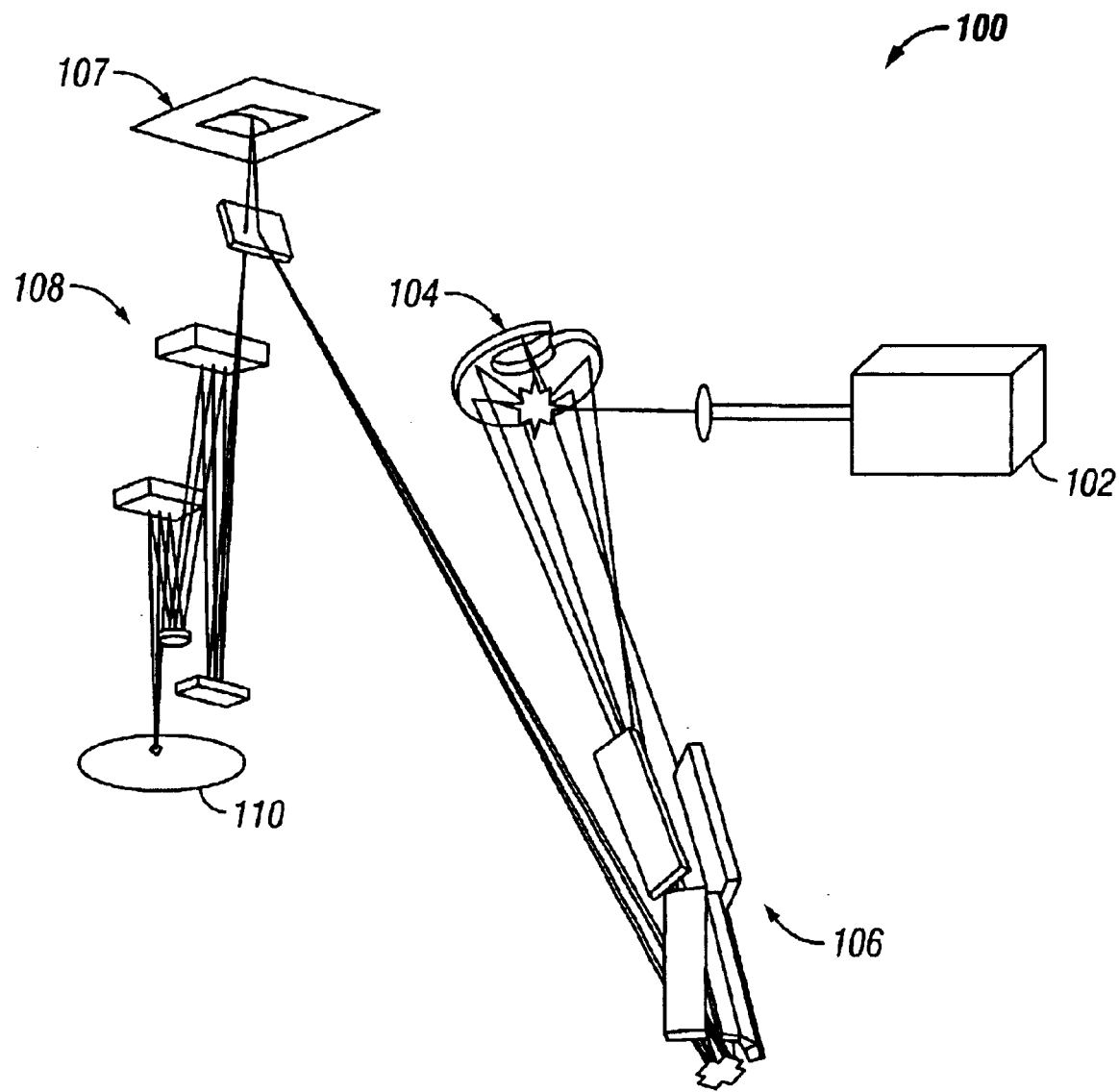
FIG. 1 illustrates one embodiment of an Extreme Ultraviolet (EUV) lithography tool.

FIG. 1 illustrates one embodiment of an Extreme Ultraviolet (EUV) lithography tool 100, which may also be called a "lithographic exposure system" or an "EUV scanner." The lithography tool 100 may include a laser 102, an electric discharge or laser produced plasma source 104, a plurality of condenser optics 106, a reflective reticle 107 with a pattern, and a plurality of reflective reduction optics 108. Other embodiments of the EUV lithography tool 100 may include other components instead of or in addition to the components shown in FIG. 1.

The EUV lithography tool 100 may create plasma by using an electric discharge or laser-produced plasma (LPP) source 104. In an embodiment, the plasma source 104 is a laser-produced plasma (LPP) source. The EUV lithography tool 100 focuses a laser 102 onto a gas, liquid, or filament jet of a material or materials, such as Xenon, to produce a plasma.

In another embodiment, the source 104 uses electric discharge to produce plasma. The EUV lithography tool 100 pulses current discharge (kAs) (like a powerful arc welder) through a gas, such as Xenon, to produce a plasma (explained further with FIGS. 2A–3 below). The plasma emits visible and EUV radiation. When the Xenon molecules are excited, the electrons jump out of their shells to produce EUV photon radiation. The source 104 may produce radiation (photons) with a very short wavelength, such as about 13 nanometers. Most materials may absorb the short-wavelength photons. In other embodiments, the photons may have other suitable wavelengths.

In an application of the EUV lithography tool 100, it is desirable to deliver about 50–120 watts of "clean" power to projection optics for a throughput of 80 wafers per hour.

Dense Plasma Focus Electric Discharge Source

Figure 2A:
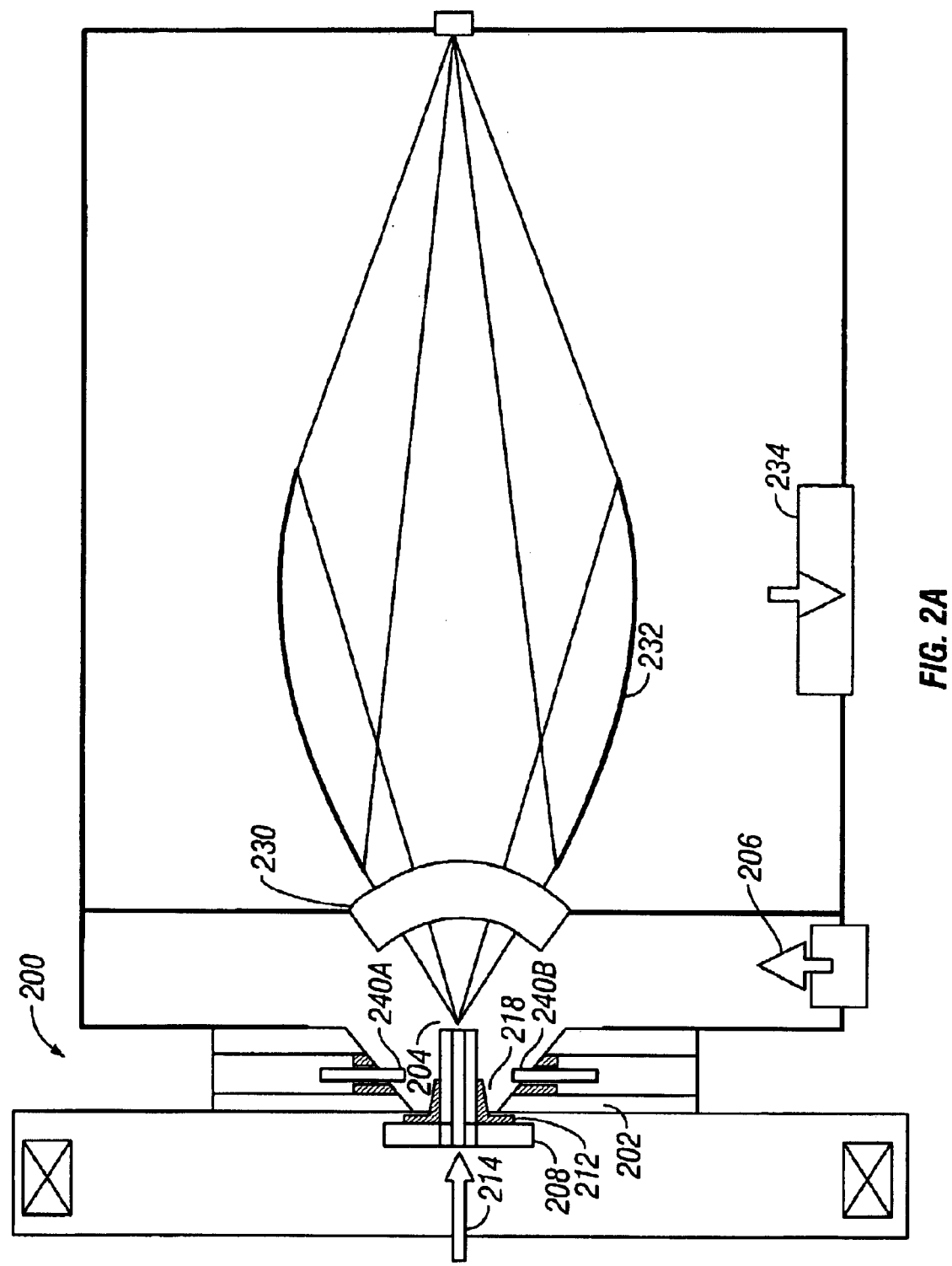
FIGS. 2A–2B are cross-sectional side views of an apparatus which may be used in a Dense Plasma Focus (DPF) electric discharge source, such as a source in FIG. 1.
Figure 2B:
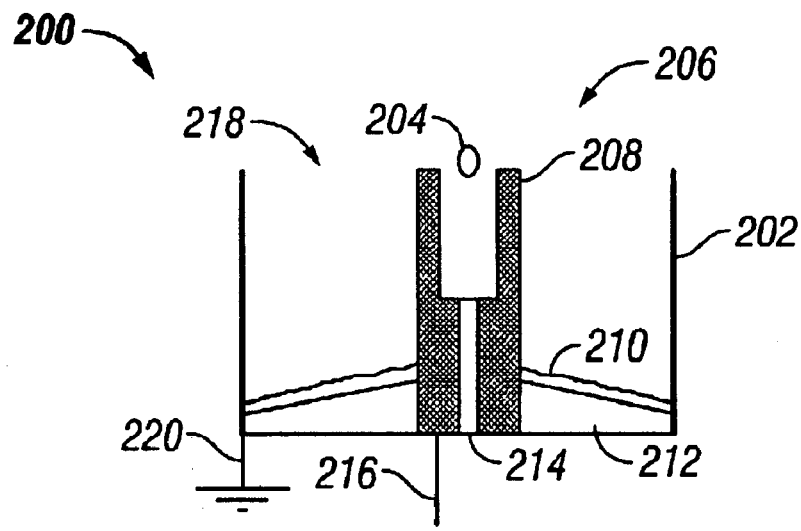

FIGS. 2A–2B are cross-sectional side views of an apparatus 200 which may be used in a Dense Plasma Focus (DPF) electric discharge source, such as the source 104 of FIG. 1. The apparatus 200 includes a cylindrically symmetric anode 208, cathode 202 and insulator 212. The apparatus 200 may be used with a buffer gas 206, such as Helium, a source gas 214, such as Xenon, a foil trap 230, a grazing incidence collector 232 and a pump 234.

The anode 208 may be coupled to a high voltage source 216. The cathode 202 may be grounded as shown by a ground symbol 220 in FIG. 2B.

Figure 4:
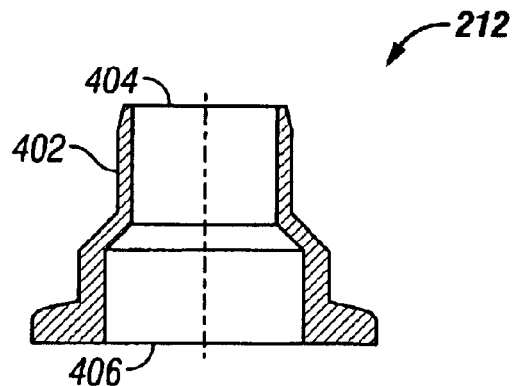
FIG. 4 is a cross-sectional side view of one embodiment of an insulator which may be slipped around the anode in FIGS. 2A–2B.

FIG. 4 is a cross-sectional side view of one embodiment of the insulator 212 (also called an "insulator collar") which may be slipped around the anode 208 (center electrode) in FIG. 2A. FIG. 4 shows examples of dimensions of the insulator 212. Other embodiments of the insulator 212 may have other shapes and/or dimensions.

Figure 5:
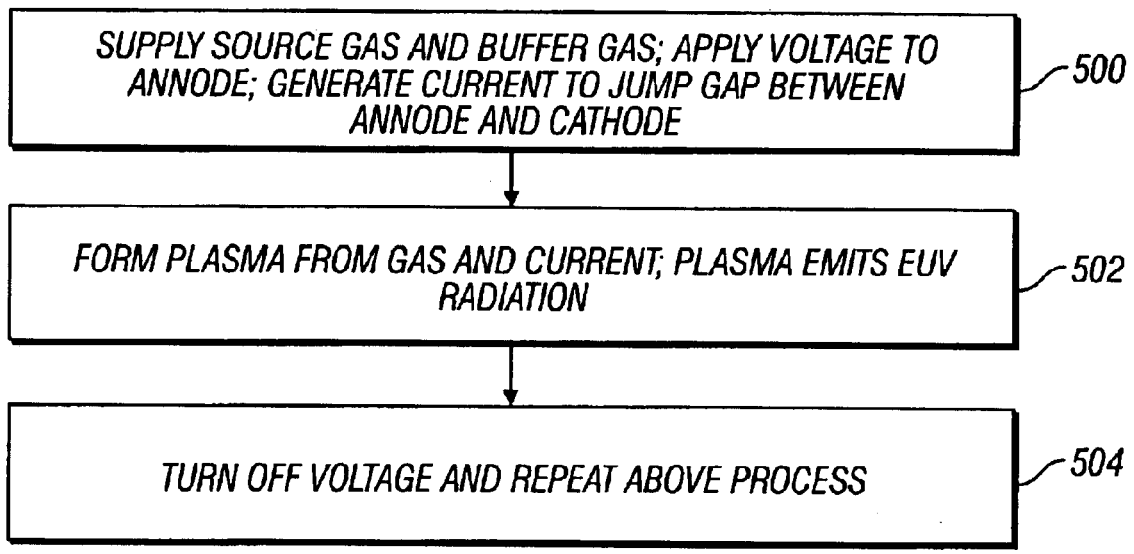
FIG. 5 is a flow chart describing a method of using the apparatus of FIGS. 2A–2B.

FIG. 5 is a flow chart describing a method of using the apparatus 200 of FIGS. 2A–2B. In a block 500, a source gas 214 (FIGS. 2A–2B), such as Xenon, is supplied through the anode 208, and a buffer gas 206, such as He, is supplied to a region 218 around the anode 208. A high positive voltage 216, such as 1 kV to 10 kV, is applied to the anode 208, i.e., across the anode 208 and the grounded cathode 202. The voltage causes a short pulse of very high current, such as about 50 kA, to jump the region or gap 218 between the electrodes 202, 208. The current causes electrons to flow through the region 218.

Figure 3:
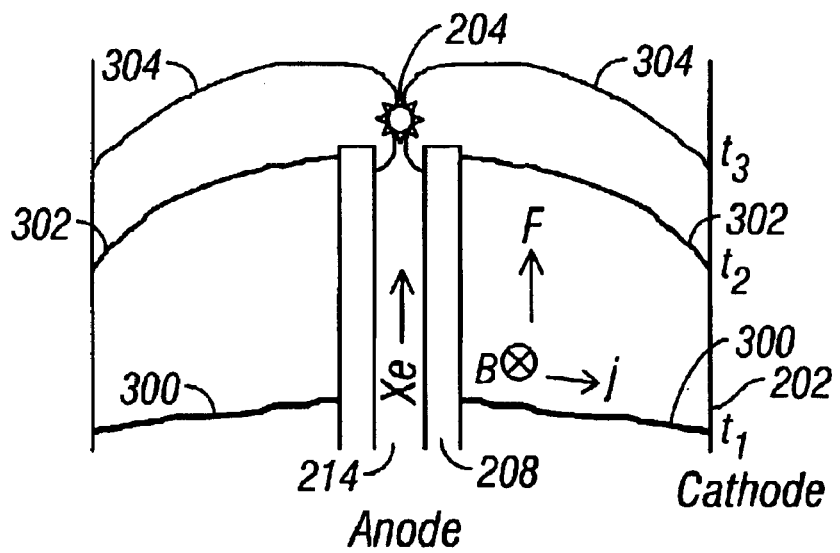
FIG. 3 illustrates a sheet of current at different points in time between an anode and a cathode in FIG. 2A.

FIG. 3 illustrates a sheet of current at different points in time between the anode 208 and cathode 202 in FIG. 2A. At a time t1, the current sheet starts at the bottom, as shown by lines 300, and produces an azimuthal B-field which causes a vertical j×B force. The current sheet moves up, as shown by lines 302 and 304, and "pinches" around the top end of the anode 208.

The region 218 may be called a "pre-ionization region." A "pre-ionization" phase may involve creating an RF potential with pre-ionization pins 240A, 240B (FIG. 2A) located at the base of the cathode 202. The electrons in the pre-ionization region 218 weakly ionize the gas atoms. This process creates an initial, pre-ionized, relatively cool plasma sheath 210 (containing both buffer gas (He) atoms and source gas (Xe) atoms) in the pre-ionization region 218 (FIG. 2B) at the base between the anode 208 and the cathode 202. This process may be referred to as pre-ionization of plasma.

The presence of the insulator 212 may help confine the electrons emerging from the pins 240A, 240B. The insulator 212 causes the current lines 300, 302, 304 in FIG. 3 to have a net angle, i.e., electrons travel slightly "upward" toward the anode 208 from the cathode 202. The ions in the plasma experience a reverse current. But the ions also experience a force due to the induced magnetic field of the electron currents. This force causes the ions to move upwards in FIG. 2B.

At the top of the anode 208, the ions smash together and create a hotter plasma "pinch" 204. The plasma pinch or source 204 populates the excited atomic states of interest and results in EUV photon emission.

In a block 502, the current "pinching" at the top of the anode 208 causes heating and densification of plasma (plasma formation) from Xenon coming up through the anode 208. This process yields a plasma source 204 which emits radiation, including EUV radiation, above the anode 208. The EUV radiation may include wavelengths around 13 nanometers.

The insulator 212 in FIG. 2A electrically insulates the cathode 202 and anode 208 from each other to prevent a short circuit. The electrical insulator 212 may also influence proper pre-ionization of the plasma, as described above.

The source gas molecules 214 may be atomically excited/stimulated. When the source gas molecules 214 de-excite, they may emit photons. Some of those photons may have the proper/desired wavelength, but very few do. Thus, it is desirable to drive more current across the electrodes 202, 208 to generate more photons with the desired wavelength.

In a block 504, the voltage 216 is turned off from the anode 208 and then applied again. The entire process (voltage applied to anode 208, then turned off) may last about 200 nanoseconds. The process may be repeated at rates of about 1–10 kHz to collect about 50–120 Watts of EUV.

During pulsed operation to form the EUV plasma source 204, there may be rapid cooling or dissipation of heat transferred from the plasma when the plasma operation is shut down. At 10 kHz, erosion of the anode 208 and heating may be severe. For example, the apparatus 200 may dissipate 25 kW.

Insulator Characteristics

It may be desirable for the insulator 212 to possess certain characteristics. For example, in addition to electrical insulation, it may be desirable for the insulator 212 to have good thermal shock resistance. The desired EUV photons, the wasted power of all of the photons at undesired wavelengths, and the resistive heating of the electrodes 202, 208 all increase the temperature of the insulator 212. In addition, the insulator 212 heats up as it is struck by high energy electrons, high energy ions, hot gas molecules, and other debris, such as melted droplets from the electrodes 202, 208.

Excessive heating followed by rapid cooling may expose the material of the electrode insulator 212 to extreme thermal stresses. This may cause the insulator material to fracture, which renders it an ineffective insulator. Thus, it may be desirable for the insulator 212 to have a high thermal-shock resistance to prevent damage during rapid cooling following pulsed operation of the apparatus 200. The material used to fabricate the insulator 212 should be able to withstand the heat load and heat dissipation without cracking, even when the hot-cold cycling reaches a high frequency.

It may also be desirable for the insulator 212 to be resistant to erosion from ion bombardment and radiation damage caused by extreme ultraviolet and longer wavelength photons. During the "rundown" and "pinch" phases of the pulsed plasma operation, the insulator material is bombarded by excessive amounts of photon, electron, and ion radiation. This bombardment may cause erosion of the insulator material into the plasma, which may have a deleterious effect on plasma formation, stability, and output power.

Standard electrode insulators may be made from Al2O3 ceramics, which include alumina and Sapphire. These materials do not solve the problems described above. For example, as a class, the standard Al2O3 insulators do not have sufficient thermal shock resistance. The thermal shock limit for Al2O3 compounds may be less than 200 degrees Centigrade. A low thermal shock limit results in fractures of the insulator 212 when the electrode material temperatures rise too high, or upon shutdown (rundown) of the plasma operation when the insulator 212 cools rapidly.

In contrast, the thermal shock resistance of various aluminosilicate ceramics, such as In Situ Reinforced Barium Aluminosilicate (IRBAS), has been observed to be as high as 4860 degrees Centigrade, which is an order of magnitude greater than 200 degrees. Improved thermal shock resistance permits the apparatus 200 to operate at a higher power, which generates more EUV. radiation. It may also be desirable for the insulator 212 to be highly thermally conductive to rapidly dissipate heat transferred from the plasma 210.

In an embodiment, the insulator 212 may be made of In Situ Reinforced Barium Aluminosilicate (IRBAS), which may be obtained from Lockheed-Martin Corporation of California. IRBAS may be machinable using standard ceramic machining techniques. IRBAS is a $Si_3N_4$ whisker reinforced barium aluminosilicate ceramic which may be fabricated by pressureless sintering of the constituents.

One form of IRBAS may have the following characteristics:

Melting temperature>>2000 degrees Centigrade

Thermal conductivity~10 Watts/meter*Kelvin (W/mK)

Coefficient of thermal expansion~$2.1*10^{-6}$ (ratio of expansion with respect to the total length per degree Celsius change in temperature. By convention, a positive coefficient means a material expands as it heats, and a negative coefficient means a material contracts as it heats. $1 \times 10^{-6}$ means 1 meter of material expands 1 micron in length if the material heats up by 1 degree Celsius)

Tensile strength~420 Mega Pascals (Mpa)

Elastic modulus~32.9 Mega pounds/square inch (Msi)

Dielectric constant (Ka band)~7.75 Other forms of IRBAS may have characteristics which are different than the characteristics listed above.

A material with high thermal conductivity and tensile strength, combined with a small thermal expansiveness, may likely have a good thermal shock resistance. The large dielectric constant indicates the material may be a good electrical insulator. The high melting temperature indicates the material may withstand proximity to very hot electrodes.

In another embodiment, the insulator 212 may be made of Nitroxyceram, which is a SiN/SiC material which may be obtained from Lockheed-Martin Corporation. Nitroxyceram may be machinable using standard ceramic machining techniques.

One form of Nitroxyceram may have the following characteristics:

Melting temperature>>2000 degrees Centigrade.

Thermal conductivity~25 W/mK

Thermal expansion~$2.27*10^{-6}$

Tensile strength~140 Mpa

Elastic modulus~13.2 Msi

Dielectric constant (Ka band)~5.7

Other forms of Nitroxyceram may have characteristics which are different than the characteristics listed above.

In other embodiments, the insulator 212 is made of some other material which may be related to IRBAS or Nitroxyceram, such as another aluminosilicate ceramic.

After the source 104 (FIG. 1) generates EUV radiation, some or all of the operations of the EUV lithography tool 100 may be performed in a vacuum to prevent EUV radiation from being affected by gases. The EUV lithography tool 100 may have optics, such as a plurality of mirrors 106, 108, which reflect EUV light in a vacuum.

The condenser optics 106 collects, shapes and/or focuses the EUV radiation into a narrow arc (or ring shape) to illuminate a scanning reflective reticle 107 (mask) with a patterned image. The EUV radiation reflects off the reticle 107 with the patterned image and may pass through reflective reduction optics 108 (e.g., 4×smaller). In a configuration, the reduction optics 108 include mirrors coated with water-wave Bragg reflectors. The image is then reproduced on a scanning wafer 110 coated with a thin layer of photoresist. The EUV lithography tool 100 may use step or scan printing.

A number of embodiments have been described. Nevertheless, it will be understood that various modifications may be made without departing from the spirit and scope of the application. Accordingly, other embodiments are within the scope of the following claims.

What is claimed is:

1. An apparatus comprising:
   an extreme ultraviolet source having an anode, a cathode, and an aluminosilicate insulator collar positioned to electrically insulate the cathode from the anode, the aluminosilicate insulator collar having a first hollow cylindrical part and a second hollow cylindrical part, the first cylindrical part having a smaller diameter than the second cylindrical part, the anode fitting through the first and second cylindrical parts, the extreme ultraviolet source being operable to produce a plasma which emits extreme ultraviolet radiation.

2. The apparatus of claim 1, further comprising a plurality of optics operable to reflect the extreme ultraviolet radiation from the extreme ultraviolet source to a location.

3. The apparatus of claim 1, wherein the extreme ultraviolet source is operable to produce radiation with a wavelength of about 13 nanometers.

4. The apparatus of claim 1, wherein the extreme ultraviolet source is an electric discharge extreme ultraviolet source.

5. The apparatus of claim 1, wherein the aluminosilicate is In Situ Reinforced Barium Aluminosilicate (IRBAS).

6. An apparatus comprising:
   an extreme ultraviolet source having an anode, a cathode, and an In Situ Reinforced Barium Aluminosilicate (IRBAS) insulator collar positioned to electrically insulate the cathode from the anode, the extreme ultraviolet source being operable to produce a plasma which emits extreme ultraviolet radiation, wherein the extreme ultraviolet source is a dense plasma focus (DPF) electric discharge extreme ultraviolet source.

7. An apparatus comprising:
   an extreme ultraviolet source having an anode, a cathode, and an In Situ Reinforced Barium Aluminosilicate (IRBAS) insulator positioned to electrically insulate the cathode from the anode, the extreme ultraviolet source being operable to produce a plasma which emits extreme ultraviolet radiation, wherein the extreme ultraviolet source is a laser produced plasma (LPP) source.

8. An apparatus comprising an extreme ultraviolet source having a Nitroxyceram insulator collar positioned to electrically insulate a cathode from an anode, the extreme ultraviolet source being operable to produce a plasma which emits extreme ultraviolet radiation.

9. The apparatus of claim 8, further comprising a plurality of optics operable to reflect the extreme ultraviolet radiation from the extreme ultraviolet source to a location.

10. The apparatus of claim 8, wherein the extreme ultraviolet source is operable to produce radiation with a wavelength of about 13 nanometers.

11. The apparatus of claim 8, wherein the extreme ultraviolet source is an electric discharge extreme ultraviolet source.

12. The apparatus of claim 8, wherein the extreme ultraviolet source is a dense plasma focus (DPF) electric discharge extreme ultraviolet source.

13. The apparatus of claim 8, wherein the extreme ultraviolet source is a laser produced plasma (LPP) source.

14. An insulator positioned to electrically insulate a cathode from an anode, the insulator having a first hollow cylindrical part and a second hollow cylindrical part, the first cylindrical part having a smaller diameter than the second cylindrical part, the first and second cylindrical parts being shaped to receive the anode, the insulator having a melting temperature above 2000 degrees Centigrade, a thermal conductivity of about 25 Watts/meter*Kelvin and a dielectric constant of about 5.7.

15. The insulator of claim 14, wherein the insulator has a thermal expansion of about $2.1*10^{-6}$ to about $2.3*10^{-6}$ meter/Celsius.

16. The insulator of claim 14, wherein the insulator has a tensile strength of about 140 to 420 Mega Pascals.

17. The insulator of claim 14, wherein the insulator has an elastic modulus of about 13 to about 33 mega pounds/square inch.

18. The insulator of claim 14, wherein the insulator comprises an aluminosilicate material.

19. The insulator of claim 14, wherein the cathode, anode and insulator are operable to produce a plasma which emits Extreme Ultraviolet radiation.

20. The insulator of claim 14, wherein the insulator is made of In Situ Reinforced Barium Aluminosilicate.

21. The insulator of claim 14, wherein the insulator is made of Nitroxyceram.

22. A method comprising:
   insulating a first portion of a cathode from a first portion of an anode with at least one of a Nitroxyceram insulator and an in-situ reinforced barium aluminosilicate (IRBAS) insulator;
   providing a source gas through the anode;
   providing a buffer gas between a second portion of the anode and a second portion of the cathode; and
   forming a plasma proximate to the anode with the source gas, the buffer-gas and an electric current, the plasma emitting extreme ultraviolet radiation.

23. The method of claim 22, wherein the extreme ultraviolet radiation has a wavelength of about 13 nanometers.

24. The method of claim 22, wherein forming a plasma comprises:
   applying voltage to the anode, the voltage causing a current sheet to form between the anode and the cathode, the current sheet pinching at an end of the anode where the source gas exits the anode; and
   removing the voltage.

25. The method of claim 24, wherein the voltage is about 1 kilovolts to about 10 kilovolts.

26. The method of claim 24, wherein the voltage is applied and removed at a frequency of about 1 kHz to about 10 kHz without affecting insulation between the cathode and anode.

27. The method of claim 22, further comprising subjecting the insulator to a temperature above 2000 degrees Centigrade without affecting insulation between the cathode and anode.

* * * * *